United States Patent
Lalongé et al.

(10) Patent No.: US 8,664,959 B2
(45) Date of Patent: Mar. 4, 2014

(54) MOBILE SYSTEM FOR MEASURING ABNORMALITY DETECTION PARAMETERS OF A SWITCH IN A HIGH VOLTAGE ELECTRICAL SUBSTATION

(75) Inventors: Patrick Lalongé, McMasterville (CA); Gilles Lanthier, Saint Jérôme (CA); David Gaudreault, L'Île Perrot (CA)

(73) Assignee: EHT International Inc., Boucherville, Quebec (CA)

(*) Notice: Subject to any disclaimer, the term of this patent is extended or adjusted under 35 U.S.C. 154(b) by 268 days.

(21) Appl. No.: 13/030,819

(22) Filed: Feb. 18, 2011

(65) Prior Publication Data
US 2012/0319692 A1 Dec. 20, 2012

Related U.S. Application Data

(60) Provisional application No. 61/307,714, filed on Feb. 24, 2010.

(51) Int. Cl.
G01R 31/327 (2006.01)
G01B 7/14 (2006.01)
G01N 27/82 (2006.01)

(52) U.S. Cl.
USPC .......... 324/415; 324/207.16; 324/242

(58) Field of Classification Search
USPC .......... 361/116, 131, 14; 324/765.01, 324/415–424, 207.23–207.25, 529, 536, 324/530, 750.22, 750.23; 307/112–113, 307/124, 139; 73/660, 650, 862, 767, 73/866.5, 866.1; 340/644, 647; 218/22, 218/51, 52, 59
See application file for complete search history.

(56) References Cited

U.S. PATENT DOCUMENTS 7,501,775 B2* 3/2009 Valdemarsson et al. ........ 318/16
7,834,498 B2* 11/2010 Shiino et al. .................... 310/71
2008/0315870 A1* 12/2008 May ............................ 324/239

* cited by examiner

Primary Examiner — Melissa Koval
Assistant Examiner — Courtney McDonnough
(74) Attorney, Agent, or Firm — Norton Rose Fulbright Canada LLP

(57) ABSTRACT

There is provided a method for measuring abnormality detection parameters of a disconnect switch, comprising: releasably connecting a first sensor to the disconnect switch, the first sensor adapted to measure a first parameter related to a position of an arm of the disconnect switch, the disconnect switch comprising a rotating actuation element operatively connected to the arm for moving the arm between a closed position and an open position; releasably connecting a second sensor to the rotating actuation element, the second sensor adapted to measure a second parameter related to a torque of the rotating actuation element; moving the arm using the actuation element; measuring and storing in memory the first and second parameters while the arm is moving; and disconnecting the first and second sensors.

3 Claims, 10 Drawing Sheets

MOBILE SYSTEM FOR MEASURING ABNORMALITY DETECTION PARAMETERS OF A SWITCH IN A HIGH VOLTAGE ELECTRICAL SUBSTATION

CROSS-REFERENCE TO RELATED APPLICATIONS

This application claims priority under 35 U.S.C. §119(e) from U.S. Provisional Patent Application No. 61/307,714, filed on Feb. 24, 2010, the contents of which are hereby incorporated by reference. The present application is related to PCT patent application bearing number PCT/CA2010/001953, filed Dec. 8, 2010, the contents of which are hereby incorporated by reference.

TECHNICAL FIELD

The present invention relates to the field of the supervision and protection of a high voltage electrical substation, and particularly to methods and mobile system for detecting anomalies of a high voltage switch.

BACKGROUND

An electrical substation is a subsidiary station of electricity generation, transmission and distribution where voltage is transformed from high to low or vice-versa using transformers. Electrical substations are usually provided with a disconnect switch having an arm movable for allowing or preventing electrical current from propagating. Because a malfunction of a disconnect switch may damage the electrical substation, some modern electrical substations are provided with some equipment for monitoring the displacement of the arm of the disconnect switch and detecting abnormal behaviors. However, older electrical substations are not provided with such abnormal behavior detection equipment and therefore, it is difficult to predict a potential wear and tear and/or an abnormal behavior.

Therefore, there is a need for an improved method and apparatus for detecting an anomaly of a high voltage switch.

SUMMARY

According to a first broad aspect, there is provided a method for measuring abnormality detection parameters of a disconnect switch, comprising: releasably connecting a first sensor to the disconnect switch, the first sensor adapted to measure a first parameter related to a position of an arm of the disconnect switch, the disconnect switch comprising a rotating actuation element operatively connected to the arm for moving the arm between a closed position and an open position; releasably connecting a second sensor to the rotating actuation element, the second sensor adapted to measure a second parameter related to a torque of the rotating actuation element; moving the arm using the actuation element; measuring and storing in memory the first and second parameters while the arm is moving; and disconnecting the first and second sensors.

According to a second broad aspect, there is provided a mobile system for measuring abnormality detection parameters of a disconnect switch, comprising: a first sensor releasably connectable to the disconnect switch and adapted to measure a first parameter related to a position of an arm of the disconnect switch, the disconnect switch comprising a rotating actuation element operatively connected to the arm for moving the arm between a closed position and an open position; a second sensor releasably connectable to the rotating actuation element and adapted to measure a second parameter related to a torque of the rotating actuation element; and a control unit adapted to coordinate the first sensor and the second sensor for concurrently measuring the first and second parameters.

According to another broad aspect, there is provided a mobile position detection system comprising: an angular position sensor adapted to measure an angular position of a rotating element; a driving device secured to the angular position sensor and engageable with the rotating element for transmitting a rotation of the rotating element to the angular position sensor; and at least two elongated and releasable fasteners secured to the angular position sensor and having an adjustable length for releasably securing the angular position sensor to a surrounding of the rotating element and engaging the driving device with the rotating element.

It should be understood that the term "switch" is to include any type of disconnectors or disconnect switches that serve to open and close a circuit at medium or high voltage. The switch may have a motorized arm for opening and closing the circuit. Alternatively, the arm may be manually actuated by a user.

It should be understood that the term "processor" is used to represent any circuit which can process data and/or signals. A Central Processing Unit (CPU), microprocessors, and microcontrollers are examples of processors.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

U.S. provisional application bearing No. 61/267,801 and of which the content is hereby incorporated by reference describes a system for detecting an abnormal behavior of a motorized disconnect switch in a high voltage electrical substation. The system is permanently secured within the electrical substation and may be integral with the control system controlling the disconnect switch. The system for detecting an abnormal behavior of the disconnect switch determines the torque of the motor driving the arm of the disconnect switch as a function of the position of the arm of the disconnect switch. The determined torque is then compared to at least one threshold and an abnormal behavior of the disconnect switch is determined as a function of the position of the determined torque with respect to the threshold.

In one embodiment, the present method and system allow for measuring abnormality detection parameters when the electrical substation is not provided with the system for detecting an abnormal behavior described in the U.S. provisional application bearing No. 61/267,801, and/or the disconnect switch is not motorized. When the disconnect switch is not motorized, a rotating handle is operatively connected to the arm of the disconnect switch for moving the arm and an operator is required for actuating the handle. The abnormality detection parameters comprise at least two parameters from which the position of the arm of the disconnect switch and the torque of the motor or the torque exerted by the operator on the handle can be determined. Once the abnormal behavior parameters have been measured and stored in memory, an abnormal behavior of the disconnect switch may be subsequently determined using any adequate methods such as the method described in U.S. provisional application bearing No. 61/267,801.

Figure 1:
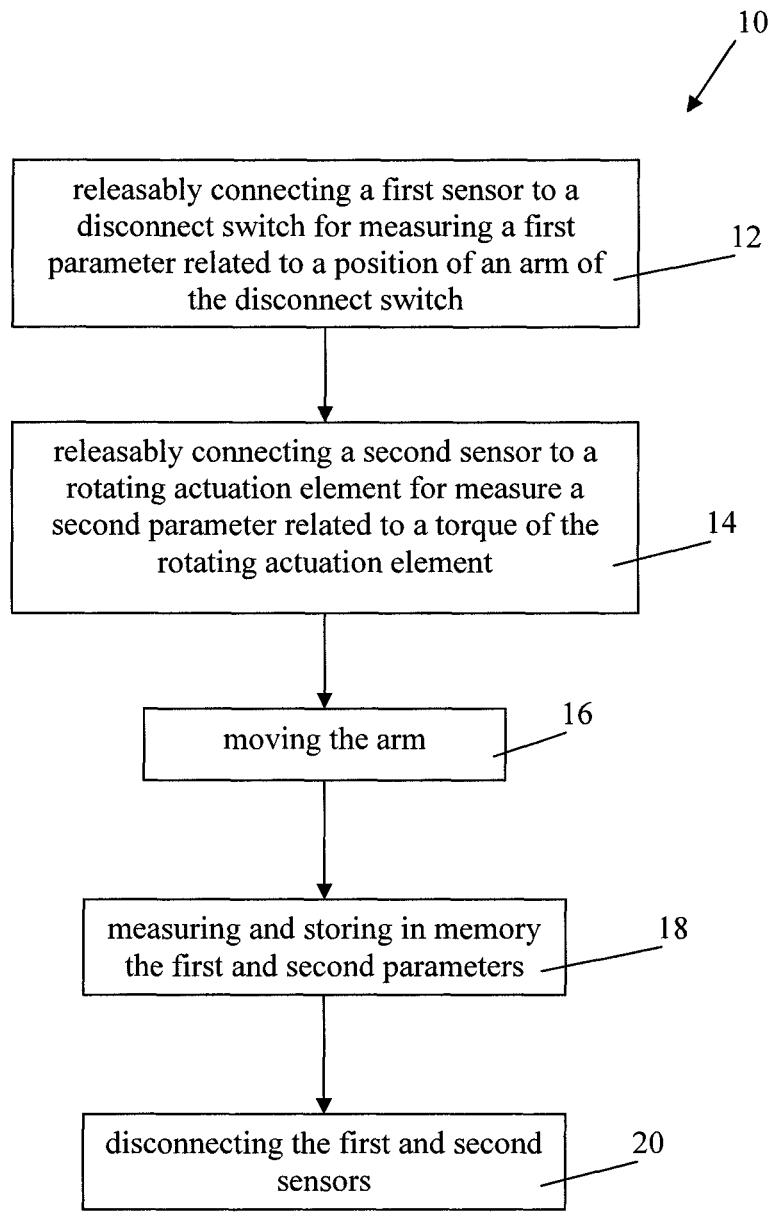
FIG. 1 is a flow chart illustrating a method for measuring abnormality detection parameters of a disconnect switch, in accordance with an embodiment.

FIG. 1 illustrates one embodiment of a method 10 for measuring abnormality detection parameters of a disconnect switch. The disconnect switch is installed in an electrical substation and comprises an arm movable between an open and a closed position. The first step 12 of the method comprises releasably connecting a first sensor to the disconnect switch. The first sensor is adapted to measure a first parameter from which the position of the arm of the disconnect switch can be determined.

In one embodiment, the first sensor is a position sensor adapted to directly measure the position of the switch arm. In this case, the first sensor is releasably secured at any adequate position, within or outside of the electrical substation, for directly measuring the position of the switch arm. The first sensor may be any adequate type of position sensor adapted to a high voltage environment such as an optical position sensor. For example, the optical position sensor may emit at least one laser beam and the optical position sensor determines the position of the arm of the switch by measuring a reflection of the laser beam on the arm.

In another embodiment, the position of the switch arm is indirectly measured by measuring an angular position of a rotating piece of equipment operatively connected to the arm of the switch and participating in the displacement of the arm. In one example, a motor is operatively connected to the arm for moving the arm. In this case, the angular position of the drive shaft extending from the motor may be measured and the position of the arm may be determined using the measured angular position of the drive shaft. Alternatively, the position of the arm may be determined by measuring the angular position of any rotating device that participates in the transmission of the rotation movement of the motor to the arm, such a drive shaft, a gear, or the like. In another embodiment, a rotating handle is manually actuated for moving the arm of the disconnect switch. In this case, the position of the arm may be determined by measuring the angular position of any rotating device that participates in the transmission of the movement of the handle to the arm to the arm, such a drive shaft, a gear, or the like. If the handle is a rotating handle, the position of the arm may be determined by measuring the angular position of the handle. It should be understood that the first sensor may be adequate type of angular position sensor. For example, the first sensor may be an optical rotary encoder. Another example of an adequate first sensor is a magnetic rotary encoder electromagnetically insulated from the electromagnetic field generated by the electrical substation.

In one embodiment, the first sensor is releasably secured within the electrical position at any adequate position allowing the measurement of the angular position of the chosen rotating part participating in the displacement of the arm.

Referring to FIG. 1, the second step 14 comprises releasably connecting a second sensor to a rotating actuation element that actuates the displacement of the switch arm. The second sensor is adapted to measure a second parameter from which a torque can be determined.

In one embodiment in which the disconnect switch comprises a motor operatively connected to the switch arm for moving the arm, the motor corresponds to the rotating actuation element and the second sensor is adapted to determine the torque of the motor.

In one embodiment in which the disconnect switch comprises a rotating handle manually actuated for moving the switch arm, the rotating handle corresponds to the rotating actuation element and the second sensor is adapted to determine the torque exerted by an operator on the rotating handle.

In another embodiment in which the disconnect switch is manually actuated using a rotating handle, a motor independent from the disconnect switch is operatively and releasably secured to the rotating handle in order to rotate the handle, and therefore move the switch arm. In this case, the independent motor corresponds to the rotating actuation element and the second sensor is adapted to determine the torque of the motor.

It should be understood that any sensor adapted to measure at least one parameter from which the torque can be determined may be used. For example, a torque sensor may be releasably connected to the motor or the rotating handle for measuring the torque of the motor or the torque exerted by the operator on the rotating handle.

In one embodiment in which a motor actuates the displacement of the switch arm, the torque of the motor is determined using operating parameters and the second sensor comprises at least one sensor adapted to measure the operating parameters. For example, if the motor is a DC electric motor, the second sensor can be an ammeter adapted to measure the electric current applied to the DC electric motor and releasably secured to the motor. In this case, the torque of the motor can be determined by multiplying the measured electric current by a proportionality constant.

In another embodiment, the motor is an AC electric motor such as a squirrel-cage AC electric motor, for example. When determining the torque of a squirrel cage asynchronous motor, certain parameters may be accessible for measurement while others may not. In one embodiment, the second sensor can comprise at least one sensor releasably secured to the motor and adapted to measure the following available parameters:

phase-to-phase stator supply voltage $E_a$
stator phase current
motor speed

The torque of the AC motor is then determined using the available parameters and any adequate method such as the method described in U.S. provisional application bearing No. 61/267,801, the content of which is hereby incorporated by reference.

In one embodiment in which the disconnect switch is manually actuated, the second sensor may be a force sensor adapted to measure the force exerted on the rotating handle by the operator. The force sensor is releasably secured to the rotating angle at a given distance from the rotation axis of the rotating handle. In this case, the torque $\vec{\Gamma}$ exerted by the operator on the rotating handle is subsequently determined using the following equation:

$$\vec{\Gamma} = \vec{r} \times \vec{F}$$

where $\vec{r}$ is a displacement vector, i.e. a vector from the point from which torque is measured to the point where force is applied, and $\vec{F}$ is the force applied by the operator.

In one embodiment, the speed of displacement of the rotating handle is substantially constant. In this case, the torque $\Gamma$ can be determined using the following equation:

$$\Gamma = 2dF$$

where d is the distance between the rotation axis of the handle and the position at which the force is applied on the handle by the operator, and F is the magnitude of the force exerted by the operator.

Referring back to FIG. 1, the third step 16 consists in moving the switch arm once the first and second sensors are releasably connected to their respective part of the disconnect switch. In one embodiment in which the disconnect switch is motorized, the step 16 consists in actuating the motor for moving the switch arm. In another embodiment, in which the disconnect switch is not motorized, the step 16 consists in manually actuating the handle for moving the switch arm.

In one embodiment, the motor or the handle is actuated for displacing the switch arm between the open and closed position in order to open or close the switch arm. In another embodiment, the motor or the handle is actuated for moving the arm of the disconnect switch from the opened or closed position and an intermediary position located between the closed and opened positions, or vice versa. Alternatively, the arm may be moved between two intermediary positions.

At step 18, the first and second parameters are measured using the first and second sensors, respectively, and stored in memory during the displacement of the switch arm. It should be understood that the first sensor and/or the second sensor may be provided with an internal memory for storing the measured values for the first and/or second parameter. Alternatively, the first and/or second sensor may be connected to an external memory for storing the measured first and/or second parameter. The external memory may be comprised in a control unit adapted to coordinate the measurement of the first and second parameters by the first and second sensor, respectively.

In one embodiment, the control unit may be adapted to determine the position of the arm and the torque using the first and second measured parameters.

The last step 20 consists in disconnecting the first and second sensors. For example, if a position sensor has been releasably secured to a rotating part of the disconnect switch at step 12, the position sensor is detached from the rotating part. In another example, if it has been releasably secured to a motor or a rotating handle at step 14, the force sensor or the torque sensor is detached from the motor or the rotating handle. In a further example, if they have been removably secured to the motor, sensors adapted to measure operating parameters of the motor are detached from the motor.

In one embodiment, once the first and second sensors have been disconnected, the measured values for the first and second parameters may be downloaded in a computer provided with a processor and a memory. The processor is configured for determining the torque as a function of the arm position and comparing the determined torque to at least one threshold in order to determine whether the displacement of the arm is normal or not, using the method described in U.S. provisional application bearing No. 61/267,801. Alternatively, the torque may be compared to a torque model defining a desired or normal behavior for the arm of the disconnect switch. In another example, the values of the torque as a function of the arm position may be compared to previously acquired torque values in order to determine whether the behavior of the disconnect switch is normal.

In one embodiment, the processor is configured for determining the position of the switch arm using the angular position of a rotating part operatively connected to the arm.

In one embodiment, the processor is configured to determine the torque of a motor using operating parameters such as the electric current applied to a DC electric motor or the phase-to-phase stator supply voltage $E_a$, the stator phase current, and the motor speed of an AC motor, as described above. The processor may also be configured for determining the torque exerted by an operator on a rotating handle using the force measured during the displacement of the handle, as described above.

In one embodiment, the step 18 of measuring the first and second parameters comprises measuring the first and second parameters as a function of time.

In one embodiment, the switch is adapted for a three-phase current and comprises three arms. Displacement of the three arms may be controlled by a single motor or handle. In this case, a single mobile system for measuring the abnormality detection parameters comprising one first sensor and one second sensor is used. Alternatively, each arm may be control by a respective motor or handle. In this case, three mobile systems each comprising one first sensor and one second sensor are used.

In one embodiment, the mobile system for measuring abnormality detection parameters comprises a control unit connected to the first and second sensors and provided with a processor adapted to coordinate the acquisition of the measurements of the first and second parameters. The control unit may be provided with a memory for storing the values measured by the two sensors. Alternatively, each sensor is provided with a respective memory.

In one embodiment, the processor may be configured for determining the torque of the motor or the torque exerted by the operator as a function of the position of the arm.

In one embodiment in which an independent motor is releasably connected to a manually actuatable disconnect switch in order to control the displacement of the arm of the disconnect switch, the control unit may be configured to control the displacement of the arm via the independent motor.

In one embodiment in which a rotating handle is manually rotated by an operator, the speed of displacement of the arm is determined in substantially real-time while the operator rotates the handle and displayed to the operator so that the operator may adjust the force he exerts on the handle to maintain a substantially constant displacement speed for the switch arm.

In one embodiment, the measured displacement speed of the arm is compared to a reference speed in real-time during the rotation of the handle. The operator then adjusts the force he exerts on the handle to maintain the displacement speed of the arm substantially equal to the reference speed.

In another embodiment, the measured displacement speed of the arm is compared to maximum and minimum reference speeds in real-time during the rotation of the handle. If the measured displacement speed is comprised between the maximum and minimum reference speeds, then the operator maintains substantially the force he exerts on the handle. If the measured displacement speed is over the maximum reference speed or below the minimum reference speed, then the operator adjusts the force he exerts on the handle. It should be understood that the displacement speed may be measured or determined by the sensor adapted to measure the first parameter from which the position of the switch arm can be determined.

In one embodiment, the reference speed corresponds to a displacement speed for the switch arm which has been previously measured while the operator exerted an adequate force on the handle which caused a substantially constant displacement speed for the switch arm.

In one embodiment, the operator opens and/or closes several times the switch arm by rotating the handle and a series of measurements are performed. For example, the operator opens the switch arm twice. During each opening of the arm, the position of the arm and the torque exerted on the handle by the operator are determined and the displacement speed of the arm is also determined or measured. Therefore, for each opening, a curve of the torque versus the arm position and a curve of the displacement speed of the arm versus the arm position are obtained. In order to obtain a single curve of the torque versus the arm position, one of the two torque values is eliminated. For each position of the arm, only the corresponding torque value of which the corresponding displacement speed for the switch arm is the closest from the reference speed is kept.

In one embodiment, irregularities in the curve of the torque versus the arm position are observed. For example, these irregularities may be caused by the inertia of the torque during the start and/or the end of the displacement of the arm. In this case, the regions of instability are not taken into account for the curve of the torque versus the position of the arm.

Figure 2:
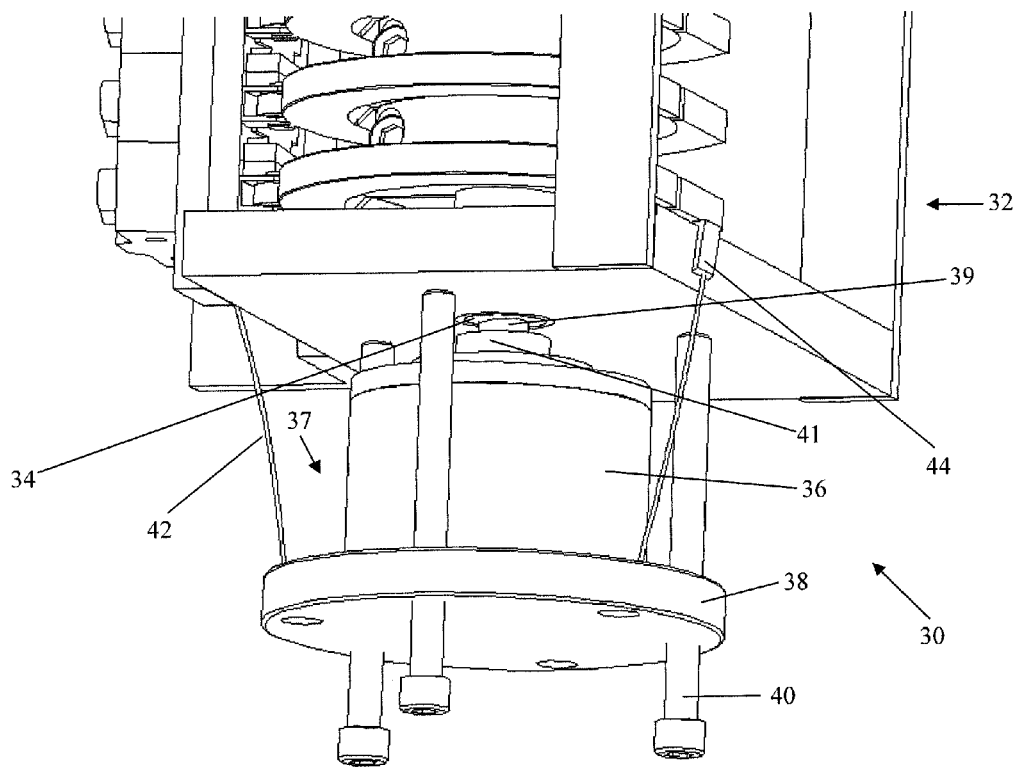
FIG. 2 illustrates a mobile angular position detection system releasably connected to a shaft of a disconnect switch, in accordance with an embodiment.

FIG. 2 illustrates one embodiment of a mobile angular position detection system 30 releasably secured to a portion of an electrical substation 32 from which a shaft 34 emerges. The shaft 34 is operatively connected to an arm of a disconnect switch comprised in the electrical substation so that a rotation of the shaft 34 drives the arm of the disconnect switch. The shaft 34 is also operatively connected to a motor or a handle so that actuation of the motor or the handle drives the shaft 34.

The angular position detection system 30 comprises an angular position sensor 36 adapted to measure an angular position and mounted to a face 37 of a support plate 38. Three elastic cables 42 each have a first end secured to the face 37 of the support plate 38 and a second end provided with a hook 44. The support plate 38 is provided with three threaded openings each adapted to receive a corresponding threaded positioning bar 40. It should be understood that the elastic cables 42 have an adequate length chosen so that the cables 42 are stretched when the system 30 is removably secured to the portion 32 of the electrical substation.

A driving disc 39 is secured to the rotating part 41 of the angular position sensor 36 and is used to ensure an adequate connection between the angular position sensor 36 and the shaft 34 so that a rotation of the shaft 34 drives by friction the angular position sensor 36.

In one embodiment, the driving disc 39 is made from a deformable and/or elastic material such as rubber for example to distribute substantially equally the pressure exerted by the driving disc over the cross-sectional surface area of the shaft 34. In the same or an alternate embodiment, the driving disc 39 comprises a non-permanent adhesive layer to be in contact with the shaft 34 in order to allow the shaft 34 to drive the rotating part 41 of the angular position sensor 36.

The system 30 is releasably secured to the portion 32 of the electrical substation by abutting the driving disc against the shaft 34 and securing the hooks 44 to the surrounding of the shaft 34. Then the positioning bars 40 are screwed or unscrewed for adjusting the position of the driving disc 39 with respect to the shaft 34. As a result, a rotation of the shaft 34 drives a rotation of the encoder which measures the angular position of the shaft 34. The measured values are stored in an external or internal memory.

It should be understood that the angular position sensor 36 may be any type of sensor adapted to measure an angular position. For example, the angular position sensor may be an optical rotary encoder, a magnetic rotary encoder electromagnetically insulated from the electromagnetic field generated by the electrical substation, or the like.

While the present mobile angular position detection system 30 is provided with three elastic cables 42, it should be understood that the number of elastic cables 42 is exemplary only, as long as the mobile angular position detection system 30 comprises at least two elastic cables. Similarly, it should be understood that the elastic cables may be provided with any adequate removable fasteners or connectors other than hooks 44. For example, each cable 42 may be provided with a screw or bolt to be releasably secured in a corresponding threaded hole of the surrounding of the shaft 34. It should also be understood that the cables 42 may extend from the face of the plate 38 opposite from the face 37 or from the annular surface of the plate 38.

It should be understood that the support plate 38 and the driving disc 39 may have any adequate shape such as cylindrical, cubic, or the like. Similarly the support plate 38 may be made from any material adequate for supporting the sensor 36 such as metal, plastic, or the like.

While the description refers to a mobile angular position detection system 30 comprising three threaded positioning bars 40, it should be understood that the number of bars is exemplary only as long the adequate number of bars allows for the positioning of the driving disc 39 with respect to the shaft 34. It should also be understood that that the threaded positioning bars may be replaced by any adequate positioning bars having a varying length. For example, the mobile angular position detection system 30 may be provided with three telescopic positioning bars. In one embodiment, the mobile angular position detection system 30 comprises no positioning bars and the cables 42 are directly secured to the angular position sensor 36.

While the present description refers to elastic cables 42, it should be understood that any adequate cable having an adjustable length may be used. For example, the mobile angular position detection system 30 may be provided with three non-elastic cable and three adjustment buckles adapted to adjust the length of the non-elastic cables in order to releasably secure the mobile angular position detection system 30 to the surrounding area of the shaft 34 and allow the driving disc 39 to engage the shaft 34.

Figure 3:
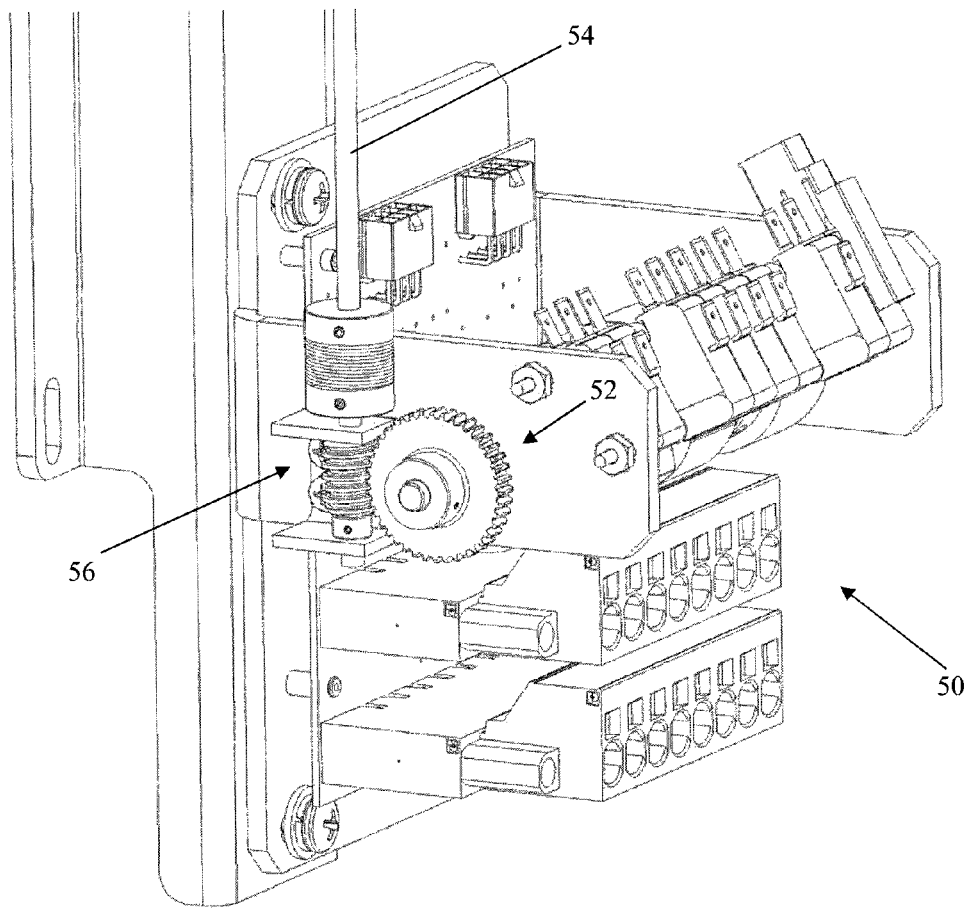
FIG. 3 illustrates a portion of a driving mechanism comprising a gear for driving a disconnect switch, in accordance with an embodiment.

FIG. 3 illustrates one embodiment of a portion of a driving system 50 for driving an arm of a disconnect switch. The portion 50 comprises a gear 52 operatively connected to a motor or a handle to be driven by the motor or the handle. The gear 52 is operatively connected to a shaft provided with a threaded portion 56 and operatively connected to the arm of the disconnect switch. The threaded portion 56 engages the gear 52 so that a rotation of the gear 52 drives the shaft 54.

Figure 4:
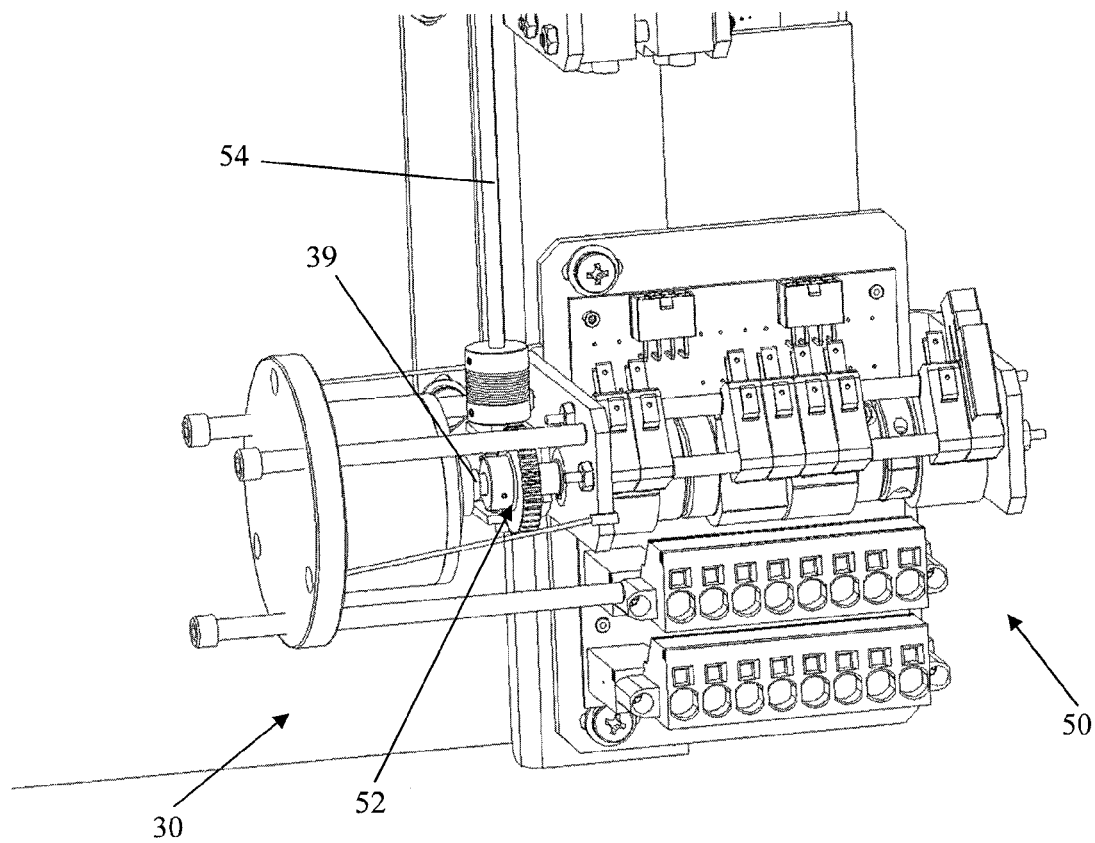
FIG. 4 illustrates a mobile angular position detection system releasably connected to the gear of FIG. 3, in accordance with an embodiment.

FIG. 4 illustrates the mobile angular position detection system 30 releasably secured to the gear 52 of the portion 50 of the driving system 50 so that the driving disc 39 engages the gear 52.

While the present description refers to a driving disc 39 for releasably connecting the sensor 36 to a gear or shaft participating in driving a switch arm, it should be understood that any driving device that allows the transfer of the rotation of any rotating part participating in driving the switch arm may be used. For example, the driving disc may be a driving gear adapted to be operatively connected to a gear of the driving system for driving the arm such as the gear 52 for example.

Figure 5:
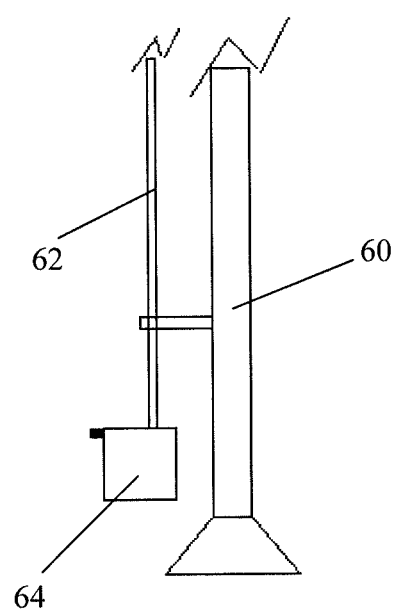
FIG. 5 illustrates an actuation device for actuating a disconnect switch secured to a post supporting the disconnect switch, in accordance with an embodiment.

FIG. 5 illustrates one embodiment of a post 60 for supporting electrical lines. A disconnect switch (not shown) is positioned on top of the post 60. As shaft 62 is rotatably secured to the post 60 and connects the switch arm to an arm actuation element 64 for driving the switch arm. The arm actuation element 64 may be a motor or a handle.

It should be understood that any adequate type of rotating handle may be used. For example, the rotating handle may be a wheel, a rotating lever, a crank, or the like.

It should be understood that the angular position sensor 36 may be provided with any adequate type of memory for storing the values for the measured angular position.

Figure 6:
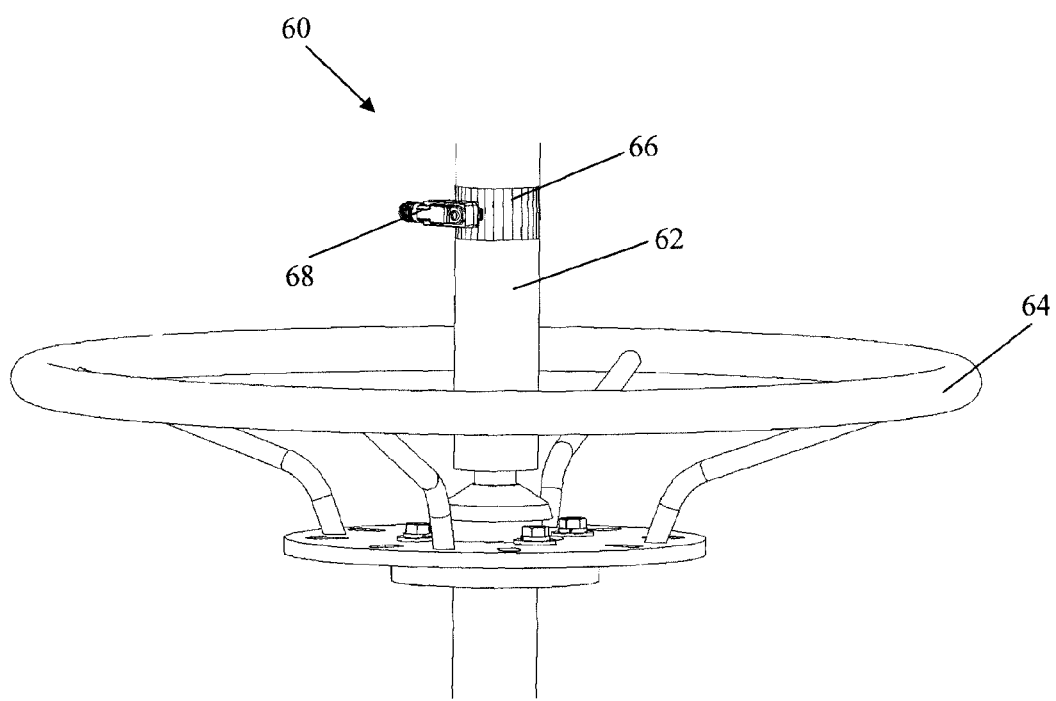
FIG. 6 illustrates an angular position sensing system connected to a shaft rotatable by a wheel, in accordance with an embodiment.

FIG. 6 illustrates one embodiment of a position sensor system 60 adapted to measure an angular position of a drive shaft 62. The shaft 62 is operatively connected to a wheel 64 and an arm of a disconnect switch so that a rotation of the wheel causes the displacement of the switch arm. The sensor system 60 comprises a sleeve 66 provided with equally spaced markers or slots and a sensor 68 adapted to measure the time elapsed for two markers to pass in front of the sensor 68. The sleeve 66 is releasably secured to the shaft 62 so that a rotation of the shaft 62 causes a rotation of the sleeve 66. The sensor 68 remains at a fixed position with respect to the sleeve 66 while the sleeve 66 rotates, detects the crossing of the markers, and measures the time at which a marker crosses the sensor 68 during the rotation of the shaft 62. The position of the arm in time is then determined using the measured values.

In one embodiment, the sensor 68 is held by an operator during the rotation of the shaft 62.

Figure 7:
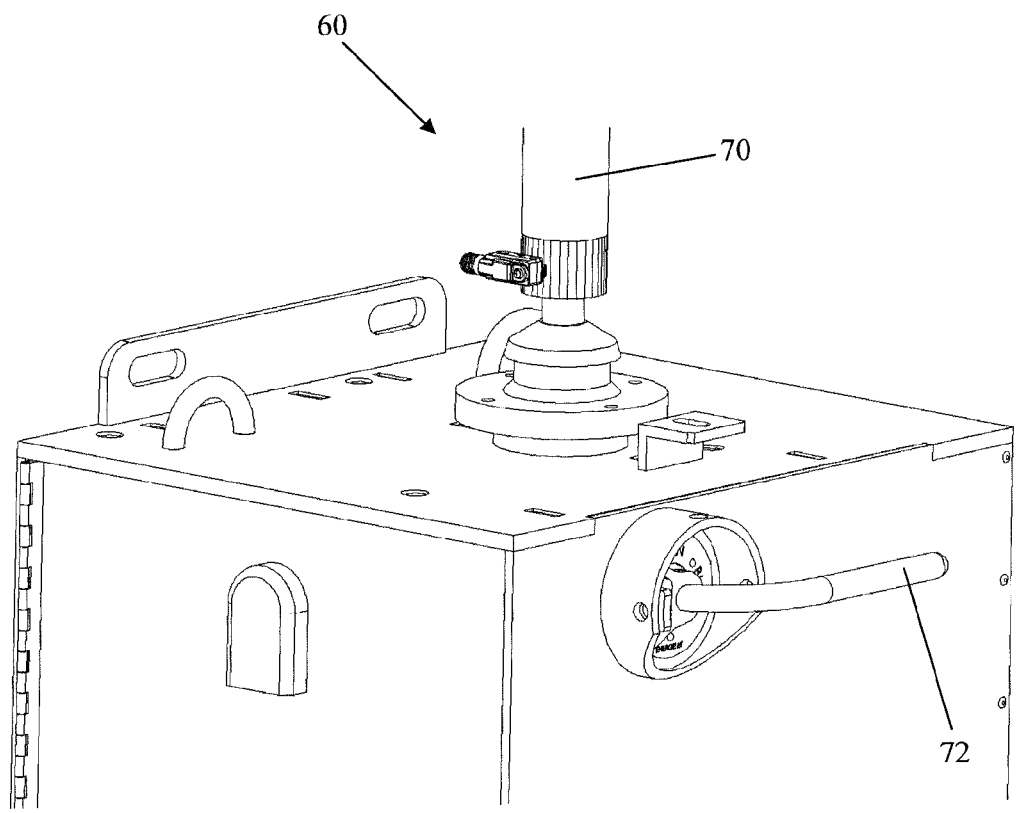
FIG. 7 illustrates an angular position sensing system connected to a shaft rotatable by a rotating lever, in accordance with an embodiment.

FIG. 7 illustrates the sensor system 60 releasably connected to a shaft 70 comprised in a driving system for driving an arm of a disconnect switch. The shaft 70 is operatively connected to a rotating lever 72 and the arm of the disconnect switch so that a rotation of the lever 72 causes the displacement of the switch arm.

Figure 8:
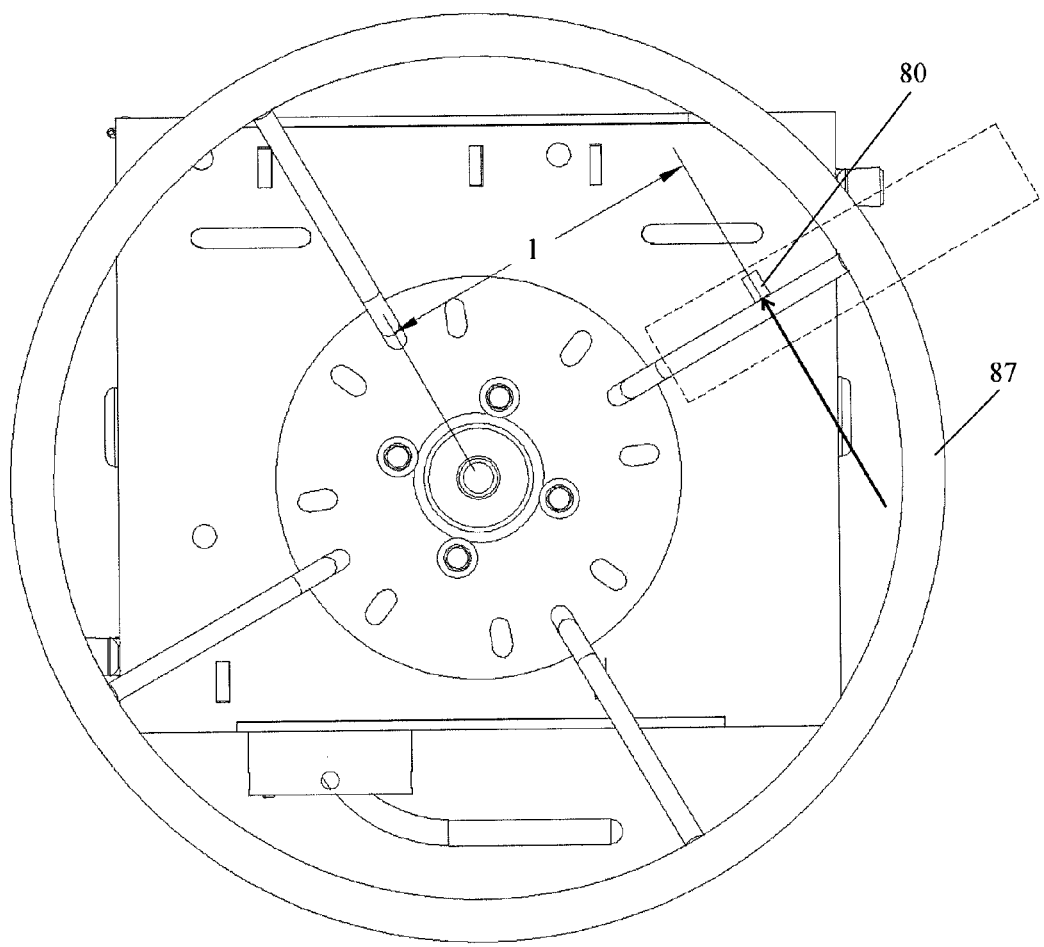
FIG. 8 illustrates a force sensor releasably secured to a wheel, in accordance with an embodiment.

FIG. 8 illustrates the positioning of a force sensor on a wheel 82. The wheel 82 is operatively connected to an arm of a disconnect switch for displacing the arm. In order to determine the torque exerted by an operator on the wheel 82 during the rotation of the wheel 82, the force sensor 80 is releasably secured to the wheel 82 at a distance 1 from the rotation axis of the wheel 82.

Figure 9:
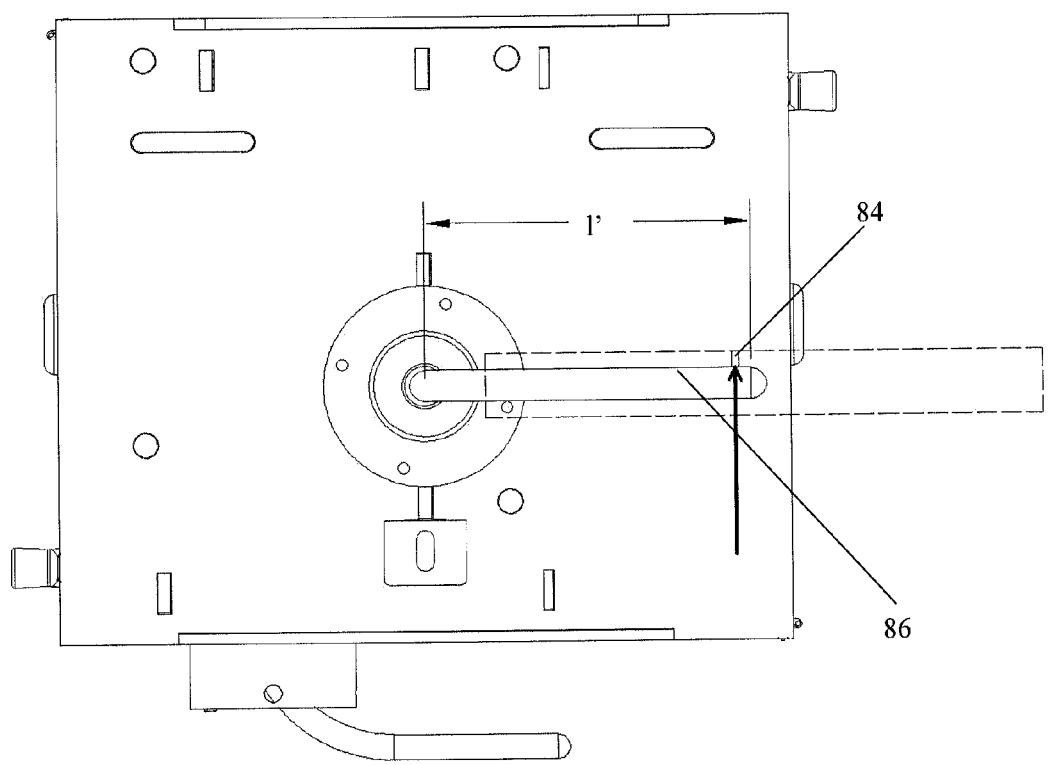
FIG. 9 illustrates a force sensor releasably secured to a rotating lever, in accordance with an embodiment.

FIG. 9 illustrates a force sensor 84 releasably secured to a rotating lever 86 used for displacing an arm of a disconnect switch. In order to determine the torque exerted by an operator on the rotating lever 86 during the rotation of the rotating lever 86, the force sensor 84 is releasably secured to the rotating lever 86 at a distance 1' from the rotation axis of the rotating lever 86.

Figure 10:
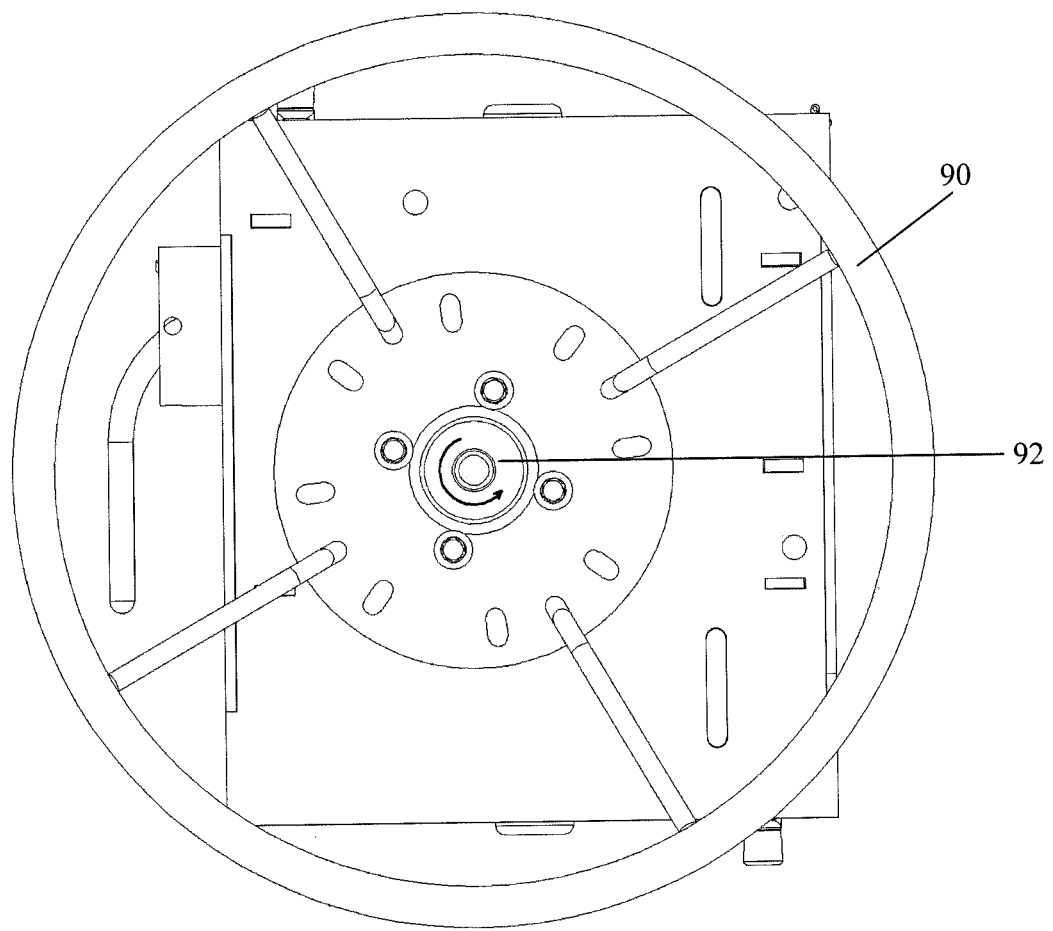
FIG. 10 illustrates a motor releasably secured to a wheel, in accordance with an embodiment.

FIG. 10 illustrates one embodiment of a wheel 90 adapted to be manually rotated in order to displace an arm of a disconnect switch. A motor 92 independent from the electrical substation is releasably secured to the wheel 90 in order to control the rotation of the wheel 90. The motor is controlled by a control unit which coordinates the measurement of the first and second parameters performed by the first and second sensors.

While the present description refers to a mobile system and method for determining abnormality detection parameters for a disconnect switch located in a high voltage electrical substation, it should be understood that the mobile system and method may be used for determining abnormality detection parameters for a disconnect switch located in a medium voltage electrical substation.

The embodiments of the invention described above are intended to be exemplary only. The scope of the invention is therefore intended to be limited solely by the scope of the appended claims.

We claim:

1. A method for measuring abnormality detection parameters of a disconnect switch, comprising:
    releasably connecting a first sensor to said disconnect switch, said first sensor adapted to measure a first parameter related to a position of an arm of said disconnect switch, said disconnect switch comprising a rotating actuation element operatively connected to said arm for moving said arm between a closed position and an open position;
    releasably connecting a second sensor to said rotating actuation element, said second sensor adapted to measure a second parameter from which a torque of said rotating actuation element is determined, said second parameter comprising one of a force exerted on said rotating actuation element, an electrical current applied to said rotating actuation element, a phase-to-phase stator supply voltage of said rotating actuation element, a stator phase current of said rotating actuation element, and a speed of said rotating actuation element;
    moving said arm using said actuation element;
    measuring and storing in memory said first and second parameters while said arm is moving; and
    disconnecting said first and second sensors.

2. A mobile system for measuring abnormality detection parameters of a disconnect switch, comprising:
    a first sensor releasably connectable to said disconnect switch and adapted to measure a first parameter related to a position of an arm of said disconnect switch, said disconnect switch comprising a rotating actuation element operatively connected to said arm for moving said arm between a closed position and an open position;
    a second sensor releasably connectable to said rotating actuation element and adapted to measure a second parameter from which a torque of said rotating actuation element is determined, said second parameter comprising one of a force exerted on said rotating actuation element, an electrical current applied to said rotating actuation element, a phase-to-phase stator supply voltage of said rotating actuation element, a stator phase current of said rotating actuation element, and a speed of said rotating actuation element; and
    a control unit adapted to coordinate said first sensor and said second sensor for concurrently measuring said first and second parameters.

3. A mobile position detection system comprising:
    an angular position sensor adapted to measure an angular position of a rotating element, the angular position sensor comprising a rotating part;

a driving device secured to the rotating part of the angular position sensor and engageable with the rotating element for transmitting a rotation of said rotating element to said angular position sensor such that the rotation of the rotating element drives by friction the angular position sensor; and at least two elongated and releasable fasteners secured to the angular position sensor and having an adjustable length for releasably securing the angular position sensor to a surrounding of the rotating element and engaging said driving device with said rotating element.

* * * * *